(12) United States Patent
Chen et al.

(10) Patent No.: US 11,538,686 B2
(45) Date of Patent: Dec. 27, 2022

(54) SEMICONDUCTOR STRUCTURE AND METHOD FOR FORMING THE SAME

(71) Applicants: Semiconductor Manufacturing International (Shanghai) Corporation, Shanghai (CN); Semiconductor Manufacturing International (Beijing) Corporation, Beijing (CN)

(72) Inventors: Zhu Chen, Shanghai (CN); Yang Ming, Shanghai (CN); Bei Duohui, Shanghai (CN); Zuopeng He, Shanghai (CN); Chao Zhang, Shanghai (CN); Ni Bai Bing, Shanghai (CN)

(73) Assignee: SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 147 days.

(21) Appl. No.: 17/155,470

(22) Filed: Jan. 22, 2021

(65) Prior Publication Data
US 2021/0398810 A1 Dec. 23, 2021

(30) Foreign Application Priority Data
Jun. 18, 2020 (CN) .......................... 202010561045.1

(51) Int. Cl.
*H01L 21/033* (2006.01)
(52) U.S. Cl.
CPC ...... *H01L 21/0338* (2013.01); *H01L 21/0332* (2013.01); *H01L 21/0335* (2013.01); *H01L 21/0337* (2013.01)

(58) Field of Classification Search
CPC ......... H01L 21/31144; H01L 21/32134; H01L 21/32135; H01L 2221/101
See application file for complete search history.

(56) References Cited

U.S. PATENT DOCUMENTS

2020/0144104 A1* 5/2020 Liu ................... H01L 21/76816

* cited by examiner

*Primary Examiner* — Walter H Swanson
(74) *Attorney, Agent, or Firm* — Crowell & Moring, L.L.P.

(57) ABSTRACT

A semiconductor structure and a method for forming the same are provided. The method includes: providing a base, a pattern transfer material layer being formed above the base; performing first ion implantation, to dope first ions into the pattern transfer material layer, to form first doped mask layers arranged in a first direction; forming first trenches in the pattern transfer material layer on two sides of the first doped mask layer in a second direction, to expose side walls of the first doped mask layer; forming mask spacers on side walls of the first trenches; performing second ion implantation, to dope second ions into some regions of the pattern transfer material layer that are exposed from the first doped mask layers and the first trenches, to form second doped mask layers; removing the remaining pattern transfer material layer, to form second trenches; and etching the base along the first trenches and the second trenches, to form a target pattern. The present disclosure improves the accuracy of pattern transfer.

13 Claims, 5 Drawing Sheets

SEMICONDUCTOR STRUCTURE AND METHOD FOR FORMING THE SAME

RELATED APPLICATIONS

The present application claims priority to Chinese Patent Appln. No. 202010561045.1, filed Jun. 18, 2020, the entire disclosure of which is hereby incorporated by reference.

BACKGROUND

Technical Field

Embodiments and implementations of the present disclosure relate to the field of semiconductor manufacturing, and in particular, to a semiconductor structure and a method for forming the same.

Related Art

With the rapid growth of the semiconductor integrated circuit (IC) industry, semiconductor technology is developing toward smaller process nodes according to the Moore's Law, making ICs develop in the direction of smaller sizes, higher circuit precision, and higher circuit complexity.

During the development of ICs, generally, a functional density (that is, the number of interconnected structures per chip) gradually increases while a geometric size (that is, the size of the smallest component that can be produced by process steps) gradually decreases, which increases the difficulty and complexity of IC manufacturing.

Currently, as technological nodes become increasingly small, it becomes challenging to enable a pattern formed on a wafer to better match a target pattern.

SUMMARY

To address problems such as those described above, embodiments and implementations of the present disclosure provide a semiconductor structure and a method for forming the same to improve the accuracy of pattern transfer.

One form of the present disclosure provides a method for forming a semiconductor structure, including: providing a base with a pattern transfer material layer being formed above the base; performing first ion implantation, to dope first ions into some regions of the pattern transfer material layer, the pattern transfer material layers doped with the first ions being used as first doped mask layers, where the first doped mask layers is arranged in a first direction, a direction perpendicular to the first direction is a second direction, and the first ion implantation is applied to increasing etch selectivity between the pattern transfer material layer and a first doped mask layer; forming first trenches in the pattern transfer material layer on two sides of the first doped mask layer in the second direction, the first trenches exposing side walls of the first doped mask layer in the second direction; forming mask spacers on side walls of the first trenches; performing second ion implantation after forming the mask spacers to dope second ions into some regions of the pattern transfer material layer that are exposed from the first doped mask layers and the first trenches, the pattern transfer material layers doped with the second ions being used as second doped mask layers, and the second ion implantation being applied to increasing etch selectivity between the pattern transfer material layer and the second doped mask layer; removing a remaining pattern transfer material layer after forming the second doped mask layers, to form a plurality of discrete second trenches; and etching the base along the first trenches and the second trenches using the first doped mask layers, the second doped mask layers, and the mask spacers as masks, to form a target pattern.

Another form of the present disclosure provides a semiconductor structure, including: a base; a pattern transfer material layer, located above the base; first ions, located in a plurality of regions of the pattern transfer material layer, the pattern transfer material layers doped with the first ions being used as first doped mask layers, where the first doped mask layers are arranged in a first direction, a direction perpendicular to the first direction is a second direction, and the first ions are applied to increasing etch selectivity between the pattern transfer material layer and the first doped mask layer; first trenches, located in the pattern transfer material layer on two sides of the first doped mask layer in the second direction, the first trenches exposing side walls of the first doped mask layer in the second direction; mask spacers, located on side walls of the first trenches; and second ions, located in some regions of the pattern transfer material layer that are exposed from the first doped mask layers and the first trenches, the pattern transfer material layers doped with the second ions being used as second doped mask layers, the second ions being applied to increasing etch selectivity between the pattern transfer material layer and the second doped mask layer, and the remaining pattern transfer material layer doped with no first ion and no second ion being configured to occupy second trenches.

Compared with the related art, technical solutions of embodiments and implementations of the present disclosure have the following advantages:

In embodiments and implementations of the present disclosure, the first doped mask layers are formed through the first ion implantation to isolate the first trenches from each other in the second direction; and the second doped mask layers are formed through the second ion implantation. In addition, both the etch selectivity between the pattern transfer material layer and the first doped mask layer and the etch selectivity between the pattern transfer material layer and the second doped mask layer are relatively high. Therefore, by removing a remaining pattern transfer material layer, the second trenches can be isolated from each other in the second direction, and the second trench can be isolated from the first trench in the first direction. Compared with a solution in which the first trenches and the second trenches are formed by directly etching the pattern transfer material layer, the process flexibility, position accuracy, and size accuracy of the ion implantation are all relatively high, and the ion implantation easily enables the first doped mask layer or the second doped mask layer to obtain a relatively small size, thereby helping accurately control sizes and positions of the first doped mask layer and the second doped mask layer. Therefore, the sizes and positions of the first trenches and the second trenches can be accurately controlled, and the formed first trenches and second trenches form a pattern meeting pattern design requirements, thereby further improving the pattern accuracy of the target pattern, and improving the accuracy of pattern transfer.

DETAILED DESCRIPTION

Figure 1:
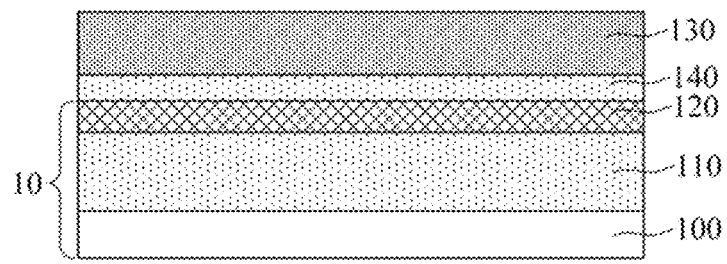
FIG. 1 to FIG. 15 are schematic structural diagrams corresponding to steps in one form of a method for forming a semiconductor structure according to the present disclosure.

It can be learned from the related art that, as technological nodes become increasingly small, it becomes challenging to enable a target pattern formed on a wafer to better match a designed pattern.

It is found through research that a pitch between photoresist patterns also decreases continuously as technological nodes become increasingly small. However, as affected by the photolithography process, when the pitch between adjacent photoresist patterns is less than a threshold distance of the photolithography process, the photoresist patterns is prone to deformation or distortion. When the photoresist patterns are transferred to a to-be-etched layer to form a target pattern (for example, a trench), the pattern accuracy of the target pattern is reduced, causing a decrease in the accuracy of pattern transfer.

To address the technical problems, in embodiments and implementations of the present disclosure, first ion implantation is performed on some regions of a pattern transfer material layer to form first doped mask layers, the first doped mask layer isolating first trenches from each other in a second direction; and second ion implantation is performed on some regions of the pattern transfer material layer that are exposed from the first doped mask layers and the first trenches, to form second doped mask layers. In addition, both etch selectivity between the pattern transfer material layer and the first doped mask layer and etch selectivity between the pattern transfer material layer and the second doped mask layer are relatively high. Therefore, after the second doped mask layers are formed, by removing the remaining pattern transfer material layer, second trenches can be isolated from each other in the second direction, and the second trench can be isolated from the first trench in a first direction. Compared with a solution in which the first trenches and the second trenches are formed by directly etching the pattern transfer material layer, the process flexibility, position accuracy, and size accuracy of the ion implantation are all relatively high, and the ion implantation easily enables the first doped mask layer or the second doped mask layer to obtain a relatively small size, thereby helping accurately control sizes and positions of the first doped mask layer and the second doped mask layer. Therefore, the sizes and positions of the first trenches and the second trenches can be accurately controlled, and the formed first trenches and second trenches form a pattern meeting pattern design requirements, thereby further improving pattern accuracy of a target pattern, and improving the accuracy of pattern transfer.

To make the foregoing objectives, features, and advantages of embodiments and implementations of the present disclosure more comprehensible, specific embodiments and implementations of the present disclosure are described below in detail with reference to the accompanying drawings.

FIG. 1 to FIG. 15 are schematic structural diagrams corresponding to steps in one form of a method for forming a semiconductor structure according to the present disclosure.

Referring to FIG. 1, a base 10 is provided. A pattern transfer material layer 130 is formed above the base 10.

The base 10 is configured to provide a process platform for a subsequent manufacturing process.

In some implementations, the base 10 includes a base structure layer 100. The base structure layer 100 includes a substrate. For example, the formed semiconductor structure is a planar transistor, then the substrate is a plane substrate.

Specifically, the substrate is a silicon substrate. In other implementations, the material of the substrate may alternatively be another material such as Ge, SiGe, SiC, GaAs, or InGa. The substrate may alternatively be a substrate of another type, such as a Si substrate on an insulator or a Ge substrate on an insulator. In other implementations, when the formed semiconductor structure is a fin field-effect transistor, the substrate may alternatively be a substrate with a fin.

The base structure layer 100 may further include other structures such as a gate structure, a doped region, a shallow trench isolation (STI) structure, and a dielectric layer. The gate structure may be a metal gate structure or a polysilicon gate structure. Specifically, the base structure layer 100 further includes an inter-layer dielectric layer (not shown) formed on the substrate and a contact (CT) hole plug (not shown) formed in the inter-layer dielectric layer.

In some implementations, the base 10 further includes a hard mask material layer 120 above the base structure layer 100. Subsequently, a pattern is formed in the pattern transfer material layer 130 and transferred to the hard mask material layer 120, and then transferred downward by the patterned hard mask material layer 120. The hard mask material layer 120 helps improve the accuracy of pattern transfer.

In some implementations, the material of the hard mask material layer 120 may include one or more of silicon oxide, silicon nitride, silicon oxynitride, silicon carbide, titanium, titanium oxide, titanium nitride, tantalum, tantalum oxide, tantalum nitride, boron nitride, copper nitride, aluminum nitride, and tungsten nitride. In an example, the hard mask material layer 120 is a metal hard mask (MHM) material layer, and the material of the hard mask material layer 120 is titanium nitride.

In some implementations, a protective layer 140 is further formed above the base structure layer 100. The protective layer 140 is located between the hard mask material layer 120 and the pattern transfer material layer 130. The protective layer 140 is configured to protect the hard mask material layer 120, to decrease a damage probability of the hard mask material layer 120 when the pattern transfer material layer 130 is patterned, thereby helping improve accuracy of the pattern subsequently formed in the hard mask material layer 120.

In some implementations, the base 100 further includes a dielectric layer 110, located between the base structure layer 100 and the hard mask material layer 120. In some implementations, the dielectric layer 110 is an inter metal dielectric (IMD) layer, and the dielectric layer 110 is configured to electrically isolate metal interconnected structures in a back end of line (BEOL) process.

In an example, the dielectric layer 110 is a first IMD layer configured to electrically isolate first metal interconnected lines (that is, MI layers). The first metal interconnected lines are metal interconnected structures closest to the CT hole plug. In other implementations, the dielectric layer may alternatively be another IMD layer located on the first metal interconnected lines and configured to electrically isolate other interconnected structures. For example, the dielectric layer is a second IMD layer configured to electrically isolate second metal interconnected lines and electrically isolate via interconnected structures located between the second metal interconnected lines and the first metal interconnected lines.

Therefore, the material of the dielectric layer 110 is a low-k dielectric material (the low-k dielectric material refers to a dielectric material having a relative dielectric constant greater than or equal to 2.6 and less than or equal to 3.9), an ultra-low-k dielectric material (the ultra-low-k dielectric material refers to a dielectric material having a relative dielectric constant less than 2.6), silicon oxide, silicon nitride, silicon oxynitride, or the like. In some implementations, the material of the dielectric layer 110 is an ultra-low-k dielectric material, to reduce a parasitic capacitance between metal interconnected structures in the BEOL, thereby reducing a BEOL RC delay. Specifically, the ultra-low-k dielectric material may be SiOCH.

Subsequently, the pattern transfer material layer 130 is patterned to transfer the pattern to the base 10 using the pattern transfer material layer 130. Therefore, etch selectivity between the hard mask material layer 120 and the pattern transfer material layer 130 is relatively high. Specifically, the material of the hard mask material layer 120 is different from the material of the pattern transfer material layer 130.

In some implementations, the material of the pattern transfer material layer 130 is amorphous silicon (a-Si). The process compatibility of amorphous silicon is relatively high. The use of amorphous silicon helps change the etching resistance of some regions of the pattern transfer material layer 130 through ion doping. In other implementations, the material of the pattern transfer material layer may alternatively be polysilicon.

It should be noted that in other implementations, the base may alternatively include a substrate and a hard mask material layer on the substrate. Subsequently, a pattern is formed in the pattern transfer material layer and transferred to the hard mask material layer, and then transferred downward by the patterned hard mask material layer to form trenches in the substrate.

Figure 2:
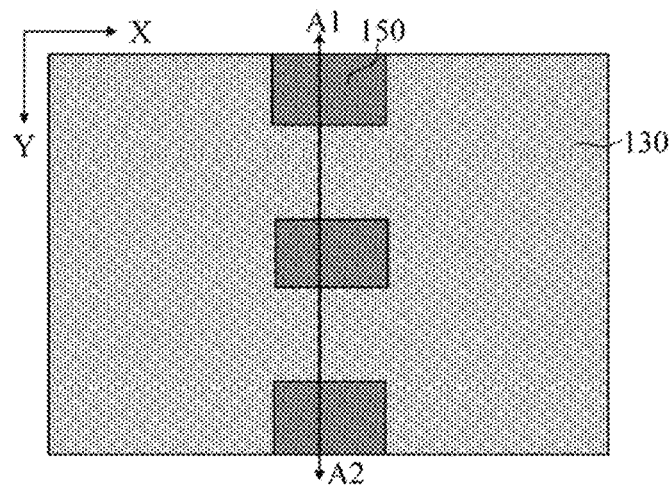
Figure 3:
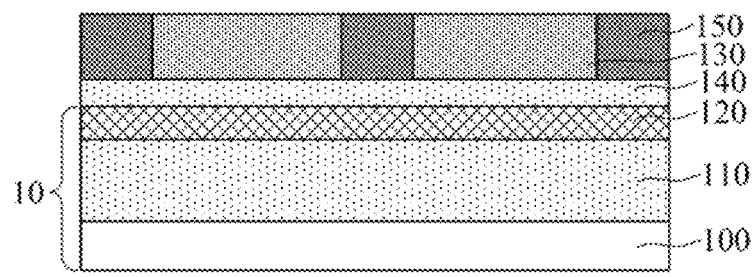

Referring to FIG. 2 and FIG. 3, FIG. 2 is a top view and FIG. 3 is a cross-sectional view of FIG. 2 along a section line A1A2. First ion implantation is performed to dope first ions into some regions of the pattern transfer material layer 130 to form a plurality of discrete first doped mask layers 150. The first doped mask layers 150 are arranged in a first direction (shown as the Y direction in FIG. 2). A direction perpendicular to the first direction is a second direction (shown as the X direction in FIG. 2). The first ion implantation is applied to increasing etch selectivity between the pattern transfer material layer 130 and the first doped mask layer 150.

Subsequently, first trenches are formed in the pattern transfer material layer 130 on two sides of the first doped mask layer 150 in the second direction. The first doped mask layer 150 is configured to isolate the first trenches from each other in the second direction. The process flexibility, position accuracy, and size accuracy of the ion implantation are all relatively high, and the ion implantation easily enables the first doped mask layer 150 to obtain a relatively small size, so that the first trenches in the second direction can have a smaller pitch at head-to-head positions, heads of adjacent first trenches are not easy to be connected, and profile quality of the adjacent first trenches at head-to-head positions are higher. The first trenches are configured to define the shapes, sizes, and positions of some parts of a subsequent target pattern, thereby helping improve the accuracy of subsequent pattern transfer.

The first ion implantation is applied to increasing the etch selectivity between the pattern transfer material layer 130 and the first doped mask layer 150. The etch selectivity between the pattern transfer material layer 130 and the first doped mask layer 150 is a ratio of an etch rate of the pattern transfer material layer 130 to an etch rate of the first doped mask layer 150 when the pattern transfer material layer 130 is etched. In other words, during subsequent etching of the pattern transfer material layer 130, the etch rate of the pattern transfer material layer 130 on which the first ion implantation is performed (that is, the first doped mask layer 150) is lower.

In some implementations the first ions are doped into some regions of the pattern transfer material layer 130 through the first ion implantation, so that the material of the first doped mask layer 150 has a different microstructure. Specifically, the first ions reduce a grain boundary gap of silicon in the material of the first doped mask layer 150, thereby improving the thermal stability and chemical stability of the first doped mask layer 150. The improvement of the stability helps improve the corrosion resistance capability of the first doped mask layer 150, so that the etch selectivity between the pattern transfer material layer 130 and the first doped mask layer 150 is increased, and therefore, a subsequent process of etching the pattern transfer material layer 130 has less impact on the first doped mask layer 150.

In some implementations, after the first ion implantation, the etch selectivity between the pattern transfer material layer 130 and the first doped mask layer 150 is greater than 30. Therefore, the ions doped through the first ion implantation include one or more types of B ions, C ions, P ions, and As ions.

In some implementations, the ions doped through the first ion implantation are B ions. By doping the B ions into amorphous silicon in some regions, the material of the first doped mask layer 150 becomes boron-doped silicon, to significantly improve the etching resistance of the first doped mask layer 150, thereby improving the etch selectivity between the pattern transfer material layer 130 and the first doped mask layer 150. Moreover, the B ions have relatively high stability, thereby helping improve the thermal stability and chemical stability of the first doped mask layer 150. In addition, the B ions are common doped ions in the semiconductor field and have relatively high process compatibility.

In some implementations, the process of the first ion implantation is an ion implantation process. By adjusting the implantation dose of the ion implantation process, the etch selectivity between the pattern transfer material layer 130 and the first doped mask layer 150 is easily adjusted.

The implantation dose of the first ion implantation should neither be excessively low nor excessively high. If the implantation dose is lower, the doping concentration of the first ions in the first doped mask layer 150 is correspondingly lower, making it difficult for the etch selectivity between the pattern transfer material layer 130 and the first doped mask layer 150 to meet process requirements. If the implantation dose is excessively high, the doping concentration of the first ions in the first doped mask layer 150 is correspondingly excessively high. The first ions in the first doped mask layer 150 easily diffuse into the remaining pattern transfer material layer 130, affecting the profiles, positions, and sizes of the first trenches subsequently. For this reason, in some implementations the implantation dose of the first ion implantation is 1E14 atoms per square centimeter to 1E16 atoms per square centimeter.

The implantation energy for the first ion implantation should neither be excessively small nor excessively large. If the implantation energy is excessively small, it is difficult to ensure that the pattern transfer material layer 130 in the entire thickness range is doped with the doped ions. Consequently, when the remaining pattern transfer material layer 130 is removed subsequently, the remaining pattern transfer material layer 130 below the first doped mask layer 150 is also removed, causing collapse of the first doped mask layer

150. If the implantation energy is excessively large, the first ions may be implanted into another film layer below the pattern transfer material layer 130, affecting normal proceeding of subsequent processes. For this reason, in some implementations the implantation energy for the first ion implantation is 1.5 KeV to 13 KeV. For example, the implantation energy for the first ion implantation is 2 KeV, 5 KeV, 7 KeV, 9 KeV, or 11 KeV.

An angle between the implantation direction of the first ion implantation and the normal of the surface of the base 100 should not be excessively large. If the angle is excessively large, the first ions may be mistakenly doped into another region of the pattern transfer material layer 130, affecting the profiles, positions, and sizes of the first trenches and the second trenches subsequently. In addition, the shadow effect further affects the profile, position, and size of the first doped mask layer 150. For this reason, in some implementations the angle between the implantation direction of the first ion implantation and the normal of the surface of the base 100 is 0 degree to 2 degrees. Specifically, the angle may be 0 degree. To be specific, the implantation direction is perpendicular to the surface of the base 100.

Figure 4:
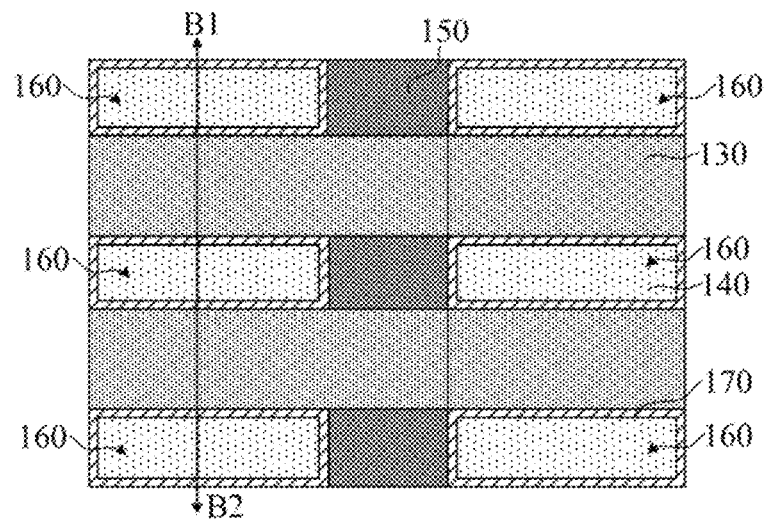
Figure 5:
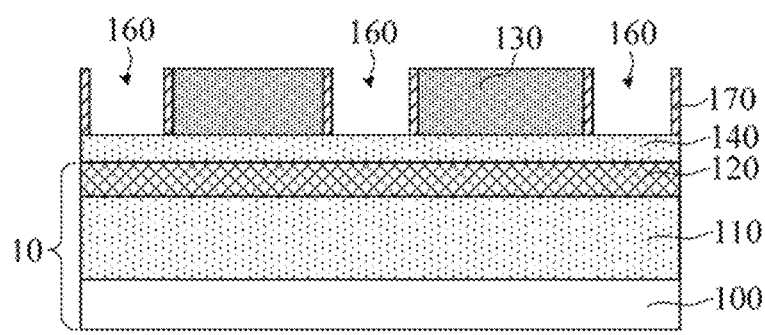

Referring to FIG. 4 and FIG. 5, FIG. 4 is a top view and FIG. 5 is a cross-sectional view of FIG. 4 along a section line B1B2. First trenches 160 are formed in the pattern transfer material layer 130 on two sides of the first doped mask layer 150 in the second direction (shown as the X direction in FIG. 2), and the first trenches 160 expose side walls of the first doped mask layer 150 in the second direction.

The first trenches 160 are configured to define the shapes, sizes, and positions of some parts of a target pattern formed in the base 10. The first trenches 160 are further configured to provide spatial positions for formation of mask spacers subsequently. In an example, the side walls of the first trench 160 are flush with the side walls of the first doped mask layer 150 in the first direction (shown as the Y direction in FIG. 2).

In some implementations, the pattern transfer material layer 130 on the two sides of the first doped mask layer 150 is etched using a dry etching process, for example, an anisotropic dry etching process, to form the first trenches 160. The anisotropic dry etching process has anisotropic etching characteristics, which helps improve the profile quality of the first trenches 160, so that the profiles, sizes, and positions of the first trenches 160 can meet the process requirements. Moreover, by adopting the dry etching process, it is easy to control an etching stop position, thereby reducing damage to the film layer below the pattern transfer material layer 130.

In some implementations, the protective layer 140 is exposed from the bottoms of the first trenches 160.

Still referring to FIG. 4 and FIG. 5, Mask spacers 170 are formed on the side walls of the first trenches 160.

Subsequently, second ion implantation is performed on some regions of the pattern transfer material layer 130 that are exposed from the first doped mask layers 150 and the first trenches 160, to form second doped mask layers, and then the remaining pattern transfer material layer 130 is removed, to form second trenches. The mask spacer 170 is configured to isolate the second trench from the first trench 160, so as to prevent the problem of communication between the second trench and the first trench 160, and enable a pitch between the second trench and first trench 160 that are adjacent to meet the designed minimum space. In addition, when patterns of the second trenches and the first trenches 160 are subsequently transferred into the base 10, the mask spacers 170 are further used as masks for etching the base 10. In addition, the mask spacer 170 is configured to adjust the pitch between the second trench and the first trench 160 in the first direction.

For this reason, the material of the mask spacer 170 is different from all of the materials of the protective layer 140, the hard mask material layer 120, the pattern transfer material layer 130, and the first doped mask layer 150. The material of the mask spacer 170 may be titanium oxide, titanium nitride, silicon oxide, silicon nitride, silicon oxynitride, or silicon carbide. In some implementations, the material of the mask spacer 170 is silicon nitride.

Specifically, the step of forming the mask spacers 170 includes: forming spacer films (not shown), the spacer films conformally covering the bottoms and the side walls of the first trenches 160, and tops of the pattern transfer material layer 130 and the first doped mask layer 150; and removing the spacer films at the bottoms of the first trenches 160 and the tops of the pattern transfer material layer 130 and the first doped mask layer 150, and retaining the remaining spacer films on the side walls of the first trenches 160 as the mask spacers 170.

In some implementations, the spacer films are formed using an atomic layer deposition process. The thickness uniformity of the spacer films formed by the atomic layer deposition process is good, and the spacer films have a good step coverage capacity, so that the spacer films can well cover the bottom corners of the first trenches 160.

In some implementations, the spacer films at the bottoms of the first trenches 160 and the tops of the pattern transfer material layer 130 and the first doped mask layer 150 are removed using a maskless etching process. Specifically, the maskless etching process is anisotropic dry etching, so that the spacer films at the bottoms of the first trenches 160 and the tops of the pattern transfer material layer 130 and the first doped mask layer 150 can be removed in a direction perpendicular to the surface of the base 10, and the spacer films on the side walls of the first trenches 160 are retained.

Because the mask spacer 170 is formed by using the maskless etching process, the width range of the mask spacer 170 is not affected by a photolithography process, and the width of the mask spacer 170 may be made very small, so that the pitch between the second trench and first trench 160 that are adjacent can meet the designed minimum space, and the mask spacer 170 still has good position accuracy and profile accuracy to avoid the problem of an alignment error caused by the existing photolithography process.

The width of the mask spacer 170 is properly set according to a target value of the pitch between the second trench and first trench 160 that are adjacent. In some embodiments, the width of the mask spacer 170 is 100 Å to 300 Å, for example, 150 Å, 200 Å, or 250 Å.

Referring to FIG. 6 to FIG. 9, after the mask spacers 170 are formed, the second ion implantation is performed to dope second ions into the some regions of the pattern transfer material layer 130 that are exposed from the first doped mask layers 150 and the first trenches 160. The pattern transfer material layers 130 doped with the second ions are used as second doped mask layers 190. The second ion implantation is applied to increasing etch selectivity between the pattern transfer material layer 130 and the second doped mask layer 190.

The second doped mask layer 190 is configured to define the positions, profiles, and sizes of the second trenches. The etch selectivity between the pattern transfer material layer 130 and the second doped mask layer 190 is relatively high, and the etch selectivity between the pattern transfer material layer 130 and the first doped mask layer 150 is also relatively high. Therefore, by subsequently removing the remaining pattern transfer material layer 130, the plurality of discrete second trenches can be formed, the second trenches can be isolated from each other in the second direction, and the second trench can be isolated from the first trench 160 in the first direction.

The process flexibility, position accuracy, and size accuracy of the ion implantation are all relatively high, and the ion implantation easily enables the second doped mask layer 190 to obtain a relatively small size, which helps accurately control a size and a position of the second doped mask layer 190. Therefore, the second trenches in the second direction can have a smaller pitch at head-to-head positions, heads of adjacent second trenches are not easy to be connected, and profile quality of the adjacent second trenches at head-to-head positions are higher, thereby accurately controlling the profiles, sizes, and positions of the second trenches.

Figure 6:
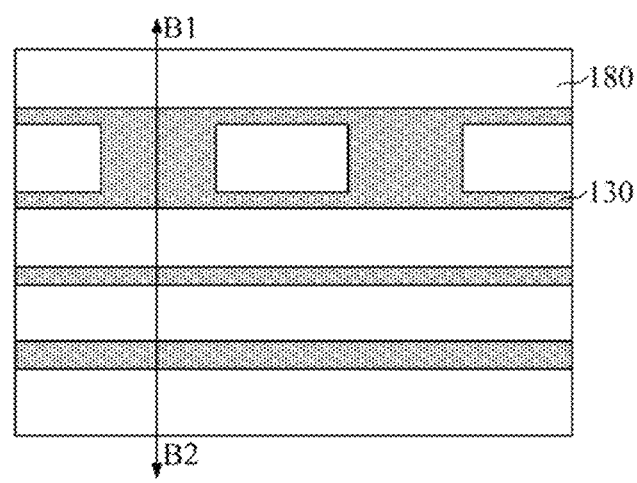
Figure 7:
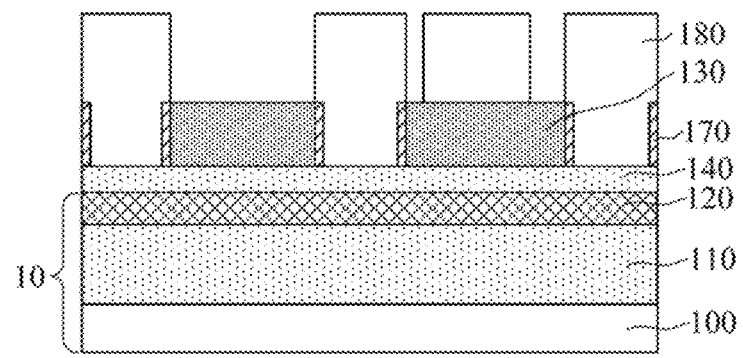

Specifically, the step of forming the second doped mask layers 190 includes as follows:

Referring to FIG. 6 and FIG. 7, FIG. 6 is a top view and FIG. 7 is a cross-sectional view of FIG. 6 along a section line B1B2. A doped mask layer 180 is formed on the pattern transfer material layer 130 and the first doped mask layer 150. Some regions of the pattern transfer material layer 130 are exposed from the doped mask layer 180.

The doped mask layer 180 is used as a mask for subsequent second ion implantation, so as to define a formation region of the second doped mask layer.

In some implementations, the material of the doped mask layer 180 is a photoresist. Processes for forming the doped mask layer 180 include a coating process, an exposure process, and a development process that are sequentially performed.

In some implementations, the doped mask layer 180 in the first trench 160 (shown in FIG. 5) may cover the top of the mask spacer 170, or the mask spacer 170 may be exposed, to enlarge a process window of an alignment process. In an example, the doped mask layer 180 further covers the top of the mask spacer 170.

Figure 8:
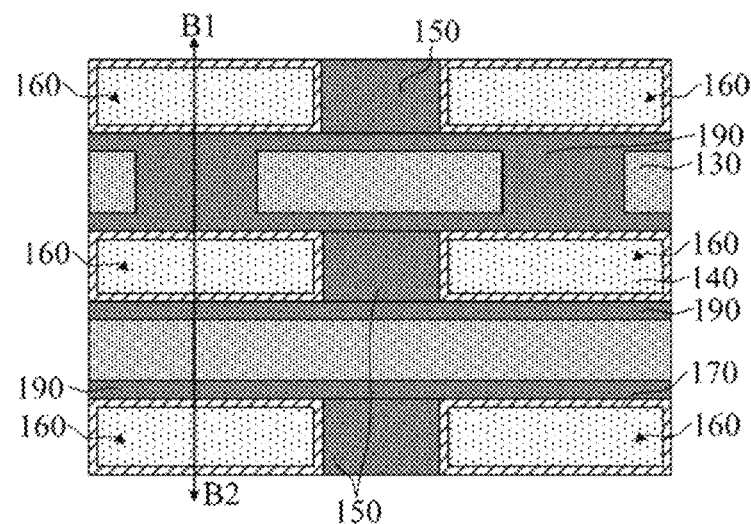
Figure 9:
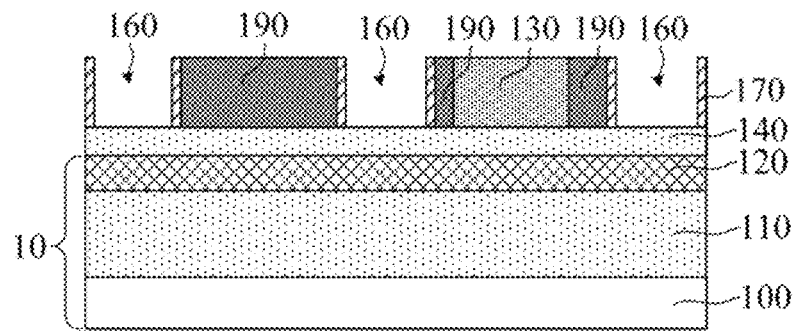

Referring to FIG. 8 and FIG. 9, FIG. 8 is a top view and FIG. 9 is a cross-sectional view of FIG. 8 along a section line B1B2. The second ion implantation is performed on the pattern transfer material layers 130 exposed from the doped mask layers 180 (shown in FIG. 7), to form the second doped mask layers 190.

The second ion implantation is applied to increasing the etch selectivity between the pattern transfer material layer 130 and the second doped mask layer 190. The etch selectivity between the pattern transfer material layer 130 and the second doped mask layer 190 is a ratio of an etch rate of the pattern transfer material layer 130 to an etch rate of the second doped mask layer 190 when the pattern transfer material layer 130 is etched. In other words, during subsequent etching of the pattern transfer material layer 130, the etch rate of the pattern transfer material layer 130 on which the second ion implantation is performed (that is, the second doped mask layer 190) is lower.

The ions doped through the second ion implantation include one or more types of B ions, C ions, P ions, and As ions. In some implementations, the ions doped through the second ion implantation are B ions. In some implementations, the process of the second ion implantation is an ion implantation process. By adjusting the implantation dose of the ion implantation process, the etch selectivity between the pattern transfer material layer 130 and the second doped mask layer 190 is easily adjusted.

The implantation dose of the second ion implantation should neither be excessively low nor excessively high. If the implantation dose is lower, a doping concentration of the second ions in the second doped mask layer 190 is correspondingly lower, making it difficult for the etch selectivity between the pattern transfer material layer 130 and the second doped mask layer 190 to meet process requirements. If the implantation dose is excessively high, the doping concentration of the second ions in the second doped mask layer 190 is correspondingly excessively high. The second ions in the second doped mask layer 190 easily diffuse into the remaining pattern transfer material layer 130, affecting the profiles, positions, and sizes of the second trenches subsequently. For this reason, in some implementations the implantation dose of the second ion implantation is 1E14 atoms per square centimeter to 1E16 atoms per square centimeter.

The implantation energy for the second ion implantation should neither be excessively small nor excessively large. If the implantation energy is excessively small, it is difficult to ensure that the pattern transfer material layer 130 in the entire thickness range is doped with the doped ions. Consequently, when the remaining pattern transfer material layer 130 is removed subsequently, the remaining pattern transfer material layer 130 below the second doped mask layer 190 is also removed, causing collapse of the second doped mask layer 190. If the implantation energy is excessively large, the second ions may be implanted into another film layer below the pattern transfer material layer 130, affecting normal proceeding of subsequent processes. For this reason, in some implementations, the implantation energy for the second ion implantation is 1.5 KeV to 13 KeV. For example, the implantation energy for the second ion implantation is 2 KeV, 5 KeV, 7 KeV, 9 KeV, or 11 KeV.

An angle between the implantation direction of the second ion implantation and the normal of the surface of the base 100 should not be excessively large. If the angle is excessively large, the doped ions may be mistakenly doped into another region of the pattern transfer material layer 130. In addition, the shadow effect further affects the profiles, positions, and sizes of the second trenches subsequently. For this reason, in some implementations, the angle between the implantation direction of the second ion implantation and the normal of the surface of the base 100 is 0 degree to 2 degrees. Specifically, the angle may be 0 degree. To be specific, the implantation direction is perpendicular to the surface of the base 100.

For specific descriptions of the second doped mask layer 190 and the second ion implantation, reference may be respectively made to the corresponding descriptions of the first doped mask layer 150 and the first ion implantation. Details are not described herein again.

In some implementations, process parameters of the first ion implantation of the second ion implantation are the same. To be specific, the ions implanted in the second ion implantation are the same as the ions implanted in the first ion implantation, the implantation dose of the second ion implantation is the same as the implantation dose of the first ion implantation, and the implantation energy for the second ion implantation is the same as the implantation energy for the first ion implantation. Therefore, ion doping concentrations and ion distributions in the first doped mask layers 150 and the second doped mask layers 190 are the same, so that the etching resistance of the first doped mask layers 150 is the same as the etching resistance of the second doped mask layers 190, which facilitates setting of process parameters of the etching process when the remaining pattern transfer material layer 130 is subsequently removed through etching to form the second trenches. In addition, the first doped mask layers 150 and the second doped mask layers 190 further need to be removed subsequently. Therefore, the same ion doping concentration of the first doped mask layers 150 and the second doped mask layers 190 facilitates subsequently removing the first doped mask layers 150 and the second doped mask layers 190 in the same step, to simplify process steps.

In some implementations, according to a design requirement of an IC, that is, according to the subsequent setting of the pitch between the second trench and the first trench 160 in the first direction, after the second doped mask layers 190 are formed, the remaining pattern transfer material layer 130 is isolated from the mask spacers 170 in the second direction by the second doped mask layers 190, or the remaining pattern transfer material layer 130 is in contact with the mask spacers 170 in the second direction, to meet a design complexity requirement of the IC. In addition, a pitch between the first trench 160 and the remaining pattern transfer material layer 130 in the first direction is adjusted, to adjust the pitch between the second trench and the first trench 160 in the first direction subsequently. When the remaining pattern transfer material layer 130 is isolated from the mask spacer 170 by the second doped mask layer 190, the pitch between the second trench and the first trench 160 in the first direction is relatively large. When the remaining pattern transfer material layer 130 is in contact with the mask spacer 170, the pitch between the second trench and the first trench 160 in the first direction is relatively small. In an example, after the second doped mask layers 190 are formed, the remaining pattern transfer material layer 130 is isolated from the mask spacer 170 in the second direction by the second doped mask layer 190.

In some implementations, after the second doped mask layers 190 are formed, the formation method further includes: removing the doped mask layer 180 (shown in FIG. 7). Specifically, the doped mask layer 180 is removed by using an ashing process.

Figure 10:
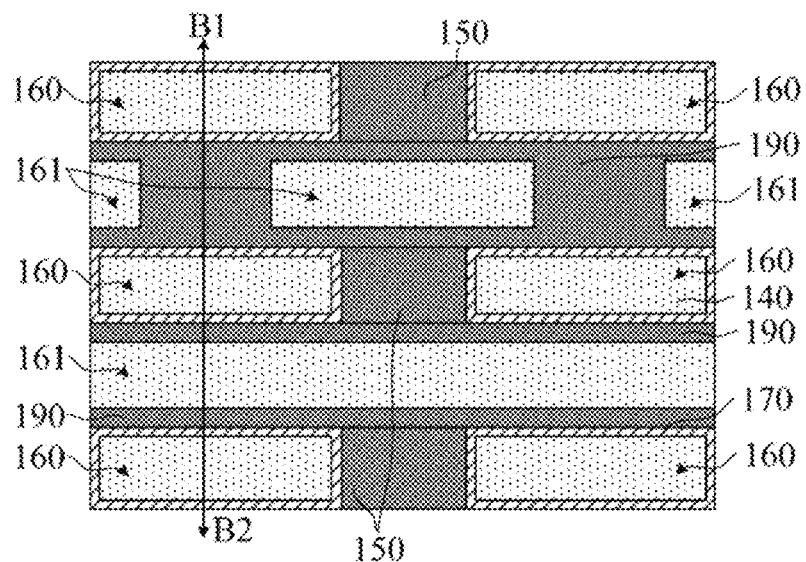
Figure 11:
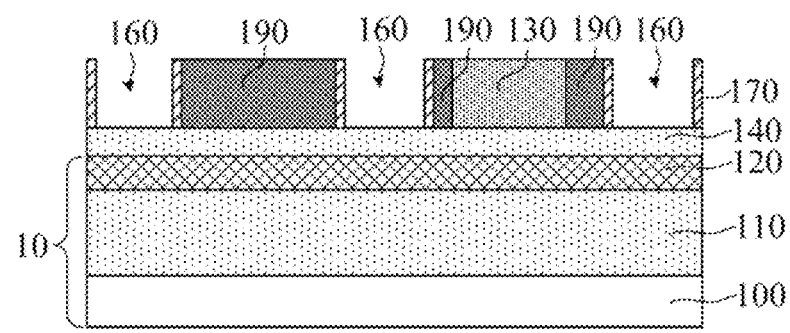

Referring to FIG. 10 and FIG. 11, FIG. 10 is a top view and FIG. 11 is a cross-sectional view of FIG. 10 along a section line B1B2. After the second doped mask layers 190 are formed, the remaining pattern transfer material layer 130 (shown in FIG. 6) is removed, to form the second trenches 161.

The second trenches 161 are configured to define the shapes, sizes, and positions of the remaining parts of the target pattern formed in the base 10. The base 10 is subsequently etched along the first trenches 160 and the second trenches 161, to form the target pattern. The size accuracy and the position accuracy of the first doped mask layers 150 and the second doped mask layers 190 are relatively high, so that the sizes and positions of the first trenches 160 and the second trenches 161 can be accurately controlled. Moreover, the first trenches 160 and the second trenches 161 form a pattern meeting pattern design requirements, and it is unnecessary to form an etch barrier layer in the first trench 160 or the second trench 161 to be used as a cut feature, thereby helping improve the pattern accuracy of the subsequent target pattern, and improving the accuracy of pattern transfer.

In addition, the first trench 160 and the second trench 161 are formed respectively in some implementations, which helps improve the process windows for forming the first trench 160 and the second trench 161 (for example, improving the optical proximity effect or relieving the limitation to the resolution of the photolithography process), so that the pattern accuracy of the first trench 160 and the second trench 161 is ensured, thereby improving the accuracy of the pattern transfer. In an example, the first trench 160 is isolated from the second trench 161 in the first direction by the mask spacer 170 and the second doped mask layer 190. In other implementations, the first trench is isolated from the second trench only by the mask spacer.

In some implementations, the protective layer 140 is exposed from the bottoms of the first trenches 160.

In some implementations, the remaining pattern transfer material layer 130 is removed using the maskless etching process. The etch selectivity between the pattern transfer material layer 130 and the first doped mask layer 150 is relatively high, and the etch selectivity between the pattern transfer material layer 130 and the second doped mask layer 190 is also relatively high. Therefore, in the process of removing the remaining pattern transfer material layer 130, the etch rates of the first doped mask layer 150 and the second doped mask layer 190 are relatively low, and the remaining pattern transfer material layer 130 can be removed using the maskless etching process, thereby simplifying process steps and reducing costs. In addition, the use of the maskless etching process significantly enlarges the process windows for forming the second trenches 161, thereby avoiding an overlay shift problem.

Specifically, the remaining pattern transfer material layer 130 is removed using a wet etching process, to form the second trenches 161. It is easy for the wet etching process to achieve relatively high etch selectivity, and in the wet etching process, the remaining pattern transfer material layer 130 is removed through chemical reaction, which helps reduce the damage to the protective layer 140 exposed from the first trenches 160, and helps remove the remaining pattern transfer material layer 130 clearly.

In some implementations, the material of the pattern transfer material layer 130 is amorphous silicon, and an etching solution used in the wet etching process is a mixed solution of $Cl_2$ and HBr or a TMAH solution.

Figure 12:
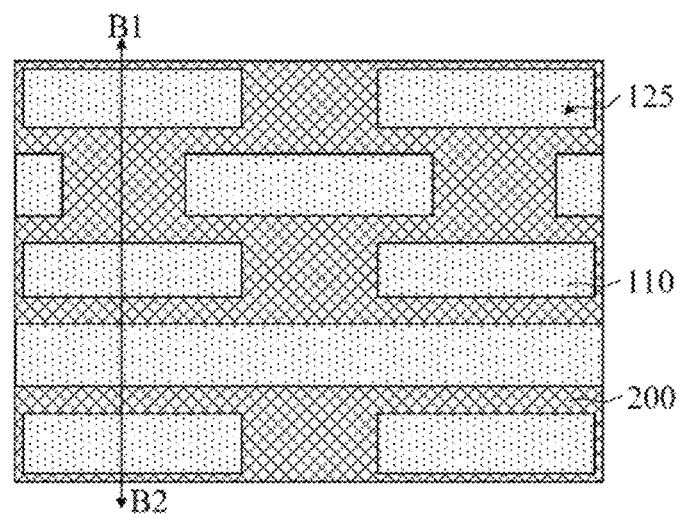
Figure 13:
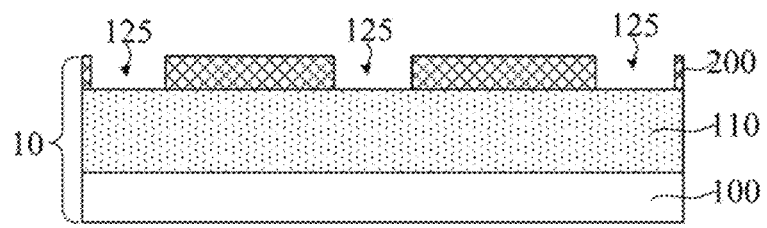

Referring to FIG. 12 and FIG. 13, FIG. 12 is a top view and FIG. 13 is a cross-sectional view of FIG. 12 along a section line B1B2. The base 10 is etched along the first trenches 160 (shown in FIG. 10) and the second trenches 161 (shown in FIG. 10) using the first doped mask layers 150 (shown in FIG. 10), the second doped mask layers 190 (shown in FIG. 10), and the mask spacers 170 (shown in FIG. 10) as masks, to form a target pattern 125.

The profile quality, size accuracy, and position accuracy of the first trenches 160 and the second trenches 161 are relatively high, and the first trenches 160 and the second trenches 161 form pattern meeting pattern design requirements. Therefore, the pattern accuracy of the target pattern 125 is improved, and the accuracy of pattern transfer is improved.

In some implementations, the hard mask material layer 120 is etched along the first trenches 160 and the second trenches 161, to form mask openings in the hard mask material layer 120. The mask openings are used as the target pattern 125, and the remaining hard mask material layer 120 is used as a hard mask layer 200. The hard mask layer 200 is used as a mask for subsequently patterning the dielectric layer 110. The pattern of the first trenches 160 and the second trenches 161 is transferred to the hard mask layer 200, and pattern accuracy of the mask openings is correspondingly relatively high.

In some implementations, because the mask spacers 170 are formed on the side walls of the first trenches 160, in the step of forming the target pattern 125, the mask spacers 170 are also used as etching masks.

In some implementations, the protective layer 140 (shown in FIG. 11) is formed on the hard mask material layer 120. Therefore, before the hard mask material layer 120 is etched, the method further includes: etching the protective layer 140, to expose the hard mask material layer 120.

In some implementations, after the target pattern 125 is formed, the formation method further includes: removing the first doped mask layers 150, the second doped mask layers 190, the mask spacers 170, and the protective layer 140. Specifically, the first doped mask layers 150, the second doped mask layers 190, the mask spacers 170, and the protective layer 140 are removed by using a dry etching process. A parameter (such as an etching gas) of the dry etching process is adjusted, so that the first doped mask layers 150, the second doped mask layers 190, the mask spacers 170, and the protective layer 140 can be removed in the same etching machine.

Figure 14:
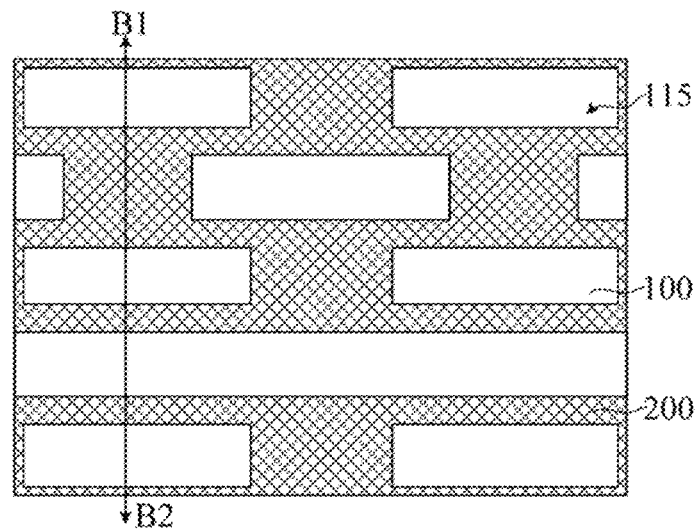
Figure 15:
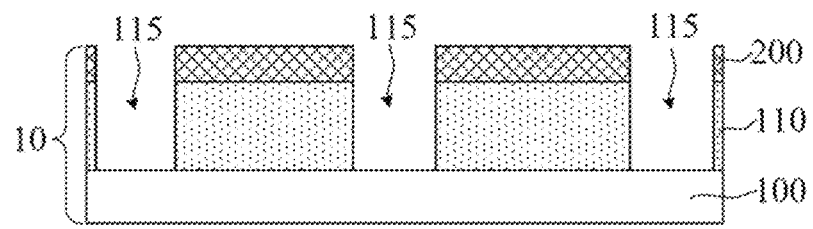

Referring to FIG. 14 and FIG. 15, FIG. 14 is a top view and FIG. 15 is a cross-sectional view of FIG. 14 along a section line B1B2. After the target pattern 125 is formed, the formation method further includes: etching the dielectric layer 110 along the mask openings (that is, the target pattern 125) using the hard mask layer 200 as a mask, to form interconnected openings 115 in the dielectric layer 110.

The interconnected openings 115 are configured to provide spatial positions for formation of metal interconnected structures. The pattern accuracy of the mask openings is relatively high, so that the pattern accuracy of the interconnected openings 115 is improved, thereby enabling the profile and layout of the interconnected structures to meet design requirements, and improving the performance of the interconnected structures.

It should be noted that as the circuit integration level increases, it becomes increasingly complex to design metal wiring in the BEOL, and a pitch between adjacent metal interconnected lines decreases continuously. In the foregoing manner of forming the first trenches 160 (shown in FIG. 10) and the second trenches 161 (shown in FIG. 10), the position accuracy, profile quality, and size accuracy of the metal interconnected lines are significantly improved, thereby improving the performance and reliability of the semiconductor structure.

The present disclosure further provides a semiconductor structure. Still referring to FIG. 10 and FIG. 11, FIG. 10 is a top view and FIG. 11 is a cross-sectional view of FIG. 10 along a section line B1B2.

The semiconductor structure includes: a base 10; a pattern transfer material layer 130, located above the base 10; first ions, located in some regions of the pattern transfer material layer 130, the pattern transfer material layers 130 doped with the first ions being used as first doped mask layers 150, the first doped mask layers 150 being arranged in a first direction (shown as the Y direction in FIG. 2), a direction perpendicular to the first direction being a second direction (shown as the X direction in FIG. 2), and the first ions being applied to increasing etch selectivity between the pattern transfer material layer 130 and the first doped mask layer 150; first trenches 160, located in the pattern transfer material layer 130 on two sides of the first doped mask layer 150 in the second direction, the first trenches 160 exposing side walls of the first doped mask layer 150 in the second direction; mask spacers 170, located on side walls of the first trenches 160; and second ions, located in some regions of the pattern transfer material layer 130 that are exposed from the first doped mask layers 150 and the first trenches 160, the pattern transfer material layers 130 doped with the second ions being used as second doped mask layers 190, the second ions being applied to increasing etch selectivity between the pattern transfer material layer 130 and the second doped mask layer 190, and the remaining pattern transfer material layer 130 doped with no first ion and no second ion being configured to occupy second trenches.

The remaining pattern transfer material layer 130 doped with no first ion and no second ion is subsequently removed, to form the second trenches, and a pattern of the first trenches 160 and the second trenches is transferred into the base 10, to form a target pattern in the base 10. In some implementations, the first trenches 160 are isolated from each other in the second direction by using the first doped mask layers 150, and both the etch selectivity between the pattern transfer material layer 130 and the first doped mask layer 150 and the etch selectivity between the pattern transfer material layer 130 and the second doped mask layer 190 are relatively high. Therefore, by subsequently removing the remaining pattern transfer material layer 130 doped with no first ion and no second ion, the second trenches can be isolated from each other in the second direction, and the second trench can be isolated from the first trench 160 in the first direction. Compared with a solution in which the first trenches and the second trenches are formed by directly etching the pattern transfer material layer, the first doped mask layers 150 and the second doped mask layers 190 are formed by using an ion implantation process. The process flexibility, position accuracy, and size accuracy of the ion implantation are all relatively high, and the ion implantation easily enables the first doped mask layer 150 or the second doped mask layer 190 to obtain a relatively small size, thereby helping accurately control sizes and positions of the first doped mask layer 150 and the second doped mask layer 190. Therefore, the sizes and positions of the first trenches 160 and the second trenches can be accurately controlled, and the first trenches 160 and the second trenches form a pattern meeting pattern design requirements, thereby further improving the pattern accuracy of the target pattern, and improving the accuracy of pattern transfer.

In some implementations, the base 10 includes a base structure layer 100. The base structure layer 100 includes a substrate. For example, the semiconductor structure is a planar transistor, then the substrate is a plane substrate. In an example, the substrate is a silicon substrate. In other implementations, when the semiconductor structure is a fin field-effect transistor, the substrate may alternatively be a substrate with a fin.

The base structure layer 100 may further include other structures such as a gate structure, a doped region, a STI structure, and a dielectric layer. The gate structure may be a metal gate structure or a polysilicon gate structure. Specifically, the base structure layer 100 further includes an inter-layer dielectric layer (not shown) formed on the substrate and a CT hole plug (not shown) in the inter-layer dielectric layer.

In some implementations, the base 10 further includes a hard mask material layer 120 above the base structure layer 100. The hard mask material layer 120 helps improve accuracy of pattern transfer. In some implementations, the hard mask material layer 120 is a layer of a hard mask material. Accordingly, the material of the hard mask material layer 120 may include at least one of silicon oxide, silicon nitride, silicon oxynitride, silicon carbide, titanium, titanium oxide, titanium nitride, tantalum, tantalum oxide, tantalum nitride, boron nitride, copper nitride, aluminum nitride, or tungsten nitride. In an example, the hard mask material layer 120 is an MHM material layer, and the material of the hard mask material layer is titanium nitride.

In some implementations, a protective layer 140 is further formed above the base structure layer 100. The protective layer 140 is located between the hard mask material layer 120 and the pattern transfer material layer 130. The protective layer 140 is configured to protect the hard mask material layer 120, to decrease a damage probability of the hard mask material layer 120 when the pattern transfer material layer 130 is patterned, thereby helping improve accuracy of a pattern subsequently formed in the hard mask material layer 120.

In some implementations, the base 100 further includes a dielectric layer 110, located between the base structure layer 100 and the hard mask material layer 120.

In some implementations, the dielectric layer 110 is an IMD layer and is configured to electrically isolate metal interconnected structures in a BEOL process. In an example, the dielectric layer 110 is a first IMD layer configured to electrically isolate first metal interconnected lines. The first metal interconnected lines are metal interconnected structures closest to the CT hole plug. In other implementations, the dielectric layer may alternatively be another IMD layer located on the first metal interconnected lines and configured to electrically isolate other interconnected structures. For example, the dielectric layer is a second IMD layer configured to electrically isolate second metal interconnected lines and electrically isolate via interconnected structures located between the second metal interconnected lines and the first metal interconnected lines.

In some implementations, the material of the dielectric layer 110 is an ultra-low-k dielectric material. Specifically, the ultra-low-k dielectric material may be SiOCH.

Etch selectivity between the hard mask material layer 120 and the pattern transfer material layer 130 is relatively high. Specifically, the material of the hard mask material layer 120 is different from the material of the pattern transfer material layer 130. In some implementations, the material of the pattern transfer material layer 130 is amorphous silicon. In other implementations, the material of the pattern transfer material layer may alternatively be polysilicon.

In some implementations, the hard mask material layer 120 is subsequently etched along the first trenches 160 and the second trenches, to form mask openings in the hard mask material layer 120. The mask openings are used as the target pattern, and the remaining hard mask material layer 120 is used as a hard mask layer. The pattern of the first trenches 160 and the second trenches 161 is transferred to the hard mask layer 200, and the pattern accuracy of the mask openings is relatively high.

The hard mask layer is used as a mask for subsequently patterning the dielectric layer 110. The dielectric layer 110 is subsequently etched along the mask openings (that is, the target pattern) by using the hard mask layer as a mask, to form interconnected openings in the dielectric layer 110. The pattern accuracy of the mask openings is relatively high, so that the pattern accuracy of the interconnected openings is improved, thereby enabling the profile and layout of the interconnected structures to meet design requirements, and improving the performance of the interconnected structures.

In other implementations, the base may alternatively include a substrate and a hard mask material layer on the substrate.

The first doped mask layer 150 is configured to isolate the first trenches 160 from each other in the second direction. The process flexibility, position accuracy, and size accuracy of the ion implantation are all relatively high, and the ion implantation easily enables the first doped mask layer 150 to obtain a relatively small size, so that the first trenches 160 in the second direction can have a smaller pitch at head-to-head positions, heads of adjacent first trenches 160 are not easy to be connected, and profile quality of the adjacent first trenches 160 at head-to-head positions are higher.

The first ions cause the material of the first doped mask layer 150 to have a different microstructure. Specifically, the first ions reduce a grain boundary gap of silicon in the material of the first doped mask layer 150, thereby improving the thermal stability and chemical stability of the first doped mask layer 150. The improvement of the stability helps improve the corrosion resistance capability of the first doped mask layer 150, so that the etch selectivity between the pattern transfer material layer 130 and the first doped mask layer 150 is increased, and therefore, a process of etching the pattern transfer material layer 130 has less impact on the first doped mask layer 150.

In some implementations, the first ions enable the etch selectivity between the pattern transfer material layer 130 and the first doped mask layer 150 to be greater than 30. Therefore, the first ions include one or more types of B ions, C ions, P ions, and As ions.

In some implementations, the first ions are B ions. By doping the B ions into amorphous silicon in some regions, the material of the first doped mask layer 150 becomes boron-doped silicon, to significantly improve the etching resistance of the first doped mask layer 150, thereby improving the etch selectivity between the pattern transfer material layer 130 and the first doped mask layer 150. Moreover, the B ions have relatively high stability, thereby helping improve the thermal stability and chemical stability of the first doped mask layer 150. In addition, the B ions are common doped ions in the semiconductor field and have relatively high process compatibility.

The first trenches 160 are configured to define the shapes, sizes, and positions of some parts of the target pattern formed in the base 10. In an example, the side walls of the first trench 160 are flush with the side walls of the first doped mask layer 150 in the first direction. In some implementations the protective layer 140 is exposed from the bottoms of the first trenches 160.

The mask spacer 170 is configured to isolate the second trench from the first trench 160, so as to prevent the problem of communication between the second trench and the first trench 160, and enable a pitch between the second trench and first trench 160 that are adjacent to meet the designed minimum space. In addition, when patterns of the second trenches and the first trenches 160 are subsequently transferred into the base 10, the mask spacers 170 are further used as masks for etching the base 10. In addition, the mask spacer 170 is configured to adjust the pitch between the second trench and the first trench 160 in the first direction.

For this reason, the material of the mask spacer 170 is different from all of the materials of the protective layer 140, the hard mask material layer 120, the pattern transfer material layer 130, and the first doped mask layer 150. The material of the mask spacer 170 may be titanium oxide, titanium nitride, silicon oxide, silicon nitride, silicon oxynitride, or silicon carbide. In some implementations, the material of the mask spacer 170 is silicon nitride.

The width of the mask spacer 170 is properly set according to a target value of the pitch between the second trench and first trench 160 that are adjacent. In some embodiments, the width of the mask spacer 170 is 100 Å to 300 Å, for example, 150 Å, 200 Å, or 250 Å.

The second doped mask layer 190 is configured to define the positions, profiles, and sizes of the second trenches. The second trenches are configured to define the shapes, sizes, and positions of the remaining parts of the target pattern formed in the base 10.

The etch selectivity between the pattern transfer material layer 130 the second doped mask layer 190 is relatively high, and the etch selectivity between the pattern transfer material layer 130 and the first doped mask layer 150 is also relatively high. Therefore, by subsequently removing the remaining pattern transfer material layer 130 doped with no first ion and no second ion, the plurality of discrete second trenches can be formed, the second trenches can be isolated from each other in the second direction, and the second trench can be isolated from the first trench 160 in the first direction.

The process flexibility, position accuracy, and size accuracy of the ion implantation are all relatively high, and the ion implantation easily enables the second doped mask layer 190 to obtain a relatively small size, which helps accurately control a size and a position of the second doped mask layer 190. Therefore, the second trenches in the second direction can have a smaller pitch at head-to-head positions, heads of adjacent second trenches are not easy to be connected, and profile quality of the adjacent second trenches at head-to-head positions are higher, thereby accurately controlling the profiles, sizes, and positions of the second trenches.

The second ions include one or more types of B ions, C ions, P ions, and As ions. In some implementations, the second ions are B ions. For descriptions of the second ions, reference may be made to the foregoing corresponding descriptions of the first ions. Details are not described herein again.

In some implementations, ion doping concentrations in the first doped mask layers 150 and the second doped mask layers 190 are the same, so that the etching resistance of the first doped mask layers 150 is the same as the etching resistance of the second doped mask layers 190, which facilitates setting of process parameters of the etching process when the remaining pattern transfer material layer 130 is subsequently removed through etching to form the second trenches. In addition, the first doped mask layers 150 and the second doped mask layers 190 further need to be removed subsequently. Therefore, the same ion doping concentration of the first doped mask layers 150 and the second doped mask layers 190 facilitates subsequently removing the first doped mask layers 150 and the second doped mask layers 190 in the same step, to simplify process steps.

In some implementations, according to a design requirement of an IC, that is, according to the setting of the pitch between the second trench and the first trench 160 in the first direction, the pattern transfer material layer 130 doped with no first ion and no second ion is isolated from the mask spacers 170 in the second direction by the second doped mask layers 190, or the pattern transfer material layer 130 doped with no first ion and no second ion is in contact with the mask spacers 170 in the second direction, to meet a design complexity requirement of the IC.

In addition, a pitch between the first trench 160 and the pattern transfer material layer 130 doped with no first ion and no second ion in the first direction is adjusted, to adjust the pitch between the second trench and the first trench 160 in the first direction.

When the pattern transfer material layer 130 doped with no first ion and no second ion is isolated from the mask spacer 170 by the second doped mask layer 190, the pitch between the second trench and the first trench 160 in the first direction is relatively large. When the pattern transfer material layer 130 doped with no first ion and no second ion is in contact with the mask spacer 170, the pitch between the second trench and the first trench 160 in the first direction is relatively small.

In an example, the pattern transfer material layer 130 doped with no first ion and no second ion is isolated from the mask spacer 170 in the second direction by the second doped mask layer 190.

In some implementations, the base 10 is subsequently etched along the first trenches 160 and the second trenches, to form the target pattern. The size accuracy and the position accuracy of the first doped mask layers 150 and the second doped mask layers 190 are relatively high, so that the sizes and positions of the first trenches 160 and the second trenches can be accurately controlled. Moreover, the first trenches 160 and the second trenches form a pattern meeting pattern design requirements, and it is unnecessary to form an etch barrier layer in the first trench 160 or the second trench to be used as a cut feature, thereby helping improve position accuracy of the subsequent target pattern, and improving the accuracy of pattern transfer.

In addition, the first trenches 160 and the second trenches in this embodiment are formed in different processes, which helps improve the process windows for forming the first trenches 160 and the second trenches (for example, improving the optical proximity effect or relieving the limitation to the resolution of the photolithography process), so that the pattern accuracy of the first trenches 160 and the second trenches is ensured, thereby improving the accuracy of the pattern transfer.

Although the present disclosure is disclosed above, the present disclosure is not limited thereto. A person skilled in the art can make various changes and modifications without departing from the spirit and the scope of the present disclosure. Therefore, the protection scope of the present disclosure should be subject to the scope defined by the claims.

What is claimed is:

1. A method for forming a semiconductor structure, comprising:
    providing a base with a pattern transfer material layer formed above the base;
    performing a first ion implantation to dope first ions into a plurality of regions of the pattern transfer material layer, the pattern transfer material layer doped with the first ions being used as first doped mask layers, where the first doped mask layers are arranged in a first direction, a direction perpendicular to the first direction being a second direction, and the first ion implantation is applied to increasing etch selectivity between the pattern transfer material layer and the first doped mask layers;
    forming first trenches in the pattern transfer material layer on two sides of the first doped mask layers in the second direction, the first trenches exposing side walls of the first doped mask layers in the second direction;
    forming mask spacers on side walls of the first trenches;
    performing a second ion implantation after forming the mask spacers to dope second ions into a plurality of regions of the pattern transfer material layer that are exposed from the first doped mask layers and the first trenches, the pattern transfer material layer doped with the second ions being used as second doped mask layers, and where the second ion implantation is applied to increasing etch selectivity between the pattern transfer material layer and the second doped mask layers;

removing a remaining pattern transfer material layer after forming the second doped mask layers to form a plurality of discrete second trenches; and etching the base along the first trenches and the second trenches using the first doped mask layers, the second doped mask layers, and the mask spacers as masks, to form a target pattern.

2. The method for forming the semiconductor structure according to claim 1, wherein a material of the pattern transfer material layer comprises amorphous silicon or polysilicon.

3. The method for forming a semiconductor structure according to claim 1, wherein:

the first ions comprise at least one of type B ions, C ions, P ions, or As ions, and the second ions comprise at least one of type of B ions, C ions, P ions, or As ions.

4. The method for forming the semiconductor structure according to claim 3, wherein parameters of the first ion implantation comprise:

implantation energy, which is 1.5 KeV to 13 KeV;

an implantation dose, which is 1E14 atoms per square centimeter to 1E16 atoms per square centimeter; and an implantation direction, an angle between the implantation direction and the normal of the surface of the base being 0 degree to 2 degrees.

5. The method for forming the semiconductor structure according to claim 3, wherein parameters of the second ion implantation comprise:

implantation energy, which is 1.5 KeV to 13 KeV;

an implantation dose, which is 1E14 atoms per square centimeter to 1E16 atoms per square centimeter; and an implantation direction, an angle between the implantation direction and the normal of the surface of the base being 0 degree to 2 degrees.

6. The method for forming the semiconductor structure according to claim 1, wherein process parameters of the second ion implantation and the first ion implantation are the same.

7. The method for forming the semiconductor structure according to claim 1, wherein in the step of performing the second ion implantation to form the second doped mask layers:

the remaining pattern transfer material layer is in contact with the mask spacers in the second direction; or the remaining pattern transfer material layer is isolated from the mask spacers in the second direction by the second doped mask layers.

8. The method for forming the semiconductor structure according to claim 1, wherein the step of forming the first trenches comprises: etching the pattern transfer material layer on the two sides of the first doped mask layer using a dry etching process.

9. The method for forming the semiconductor structure according to claim 1, wherein in the step of forming the second trenches, the remaining pattern transfer material layer is removed using a maskless etching process.

10. The method for forming the semiconductor structure according to claim 1, wherein in the step of forming the second trenches, the remaining pattern transfer material layer is removed using a wet etching process.

11. The method for forming the semiconductor structure according to claim 1, wherein the step of forming the mask spacers comprises:

forming spacer films, the spacer films conformally covering bottoms and the side walls of the first trenches, and tops of the pattern transfer material layer and the first doped mask layers; and removing the spacer films at the bottoms of the first trenches and the tops of the pattern transfer material layer and the first doped mask layers, and retaining the remaining spacer films on the side walls of the first trenches as the mask spacers.

12. The method for forming the semiconductor structure according to claim 11, wherein a process for forming the spacer films comprises an atomic layer deposition process.

13. The method for forming the semiconductor structure according to claim 1, wherein:

the base comprises: a base structure layer, a dielectric layer on the base structure layer, and a hard mask material layer on the dielectric layer;

the step of etching the base along the first trenches and the second trenches using the first doped mask layers, the second doped mask layers, and the mask spacers as masks comprises:

etching the hard mask material layer along the first trenches and the second trenches, and forming mask openings in the hard mask material layer, the mask openings used as the target pattern, and a remaining hard mask material layer being used as a hard mask layer; and after the target pattern is formed, the formation method further comprises: etching the dielectric layer along the mask openings using the hard mask layer as a mask, and forming interconnected openings in the dielectric layer.

\* \* \* \* \*

UNITED STATES PATENT AND TRADEMARK OFFICE
CERTIFICATE OF CORRECTION

PATENT NO. : 11,538,686 B2
APPLICATION NO. : 17/155470
DATED : December 27, 2022
INVENTOR(S) : Zhu Chen et al.

Page 1 of 1

It is certified that error appears in the above-identified patent and that said Letters Patent is hereby corrected as shown below:

On the Title Page

In Item (73) Assignee, please insert the following: --SEMICONDUCTOR MANUFACTURING INTERNATIONAL (SHANGHAI) CORPORATION, Shanghai (CN)--

Signed and Sealed this
Nineteenth Day of September, 2023

Katherine Kelly Vidal
*Director of the United States Patent and Trademark Office*